United States Patent [19]

Clemens et al.

[11] Patent Number: 5,371,652
[45] Date of Patent: Dec. 6, 1994

[54] SPRING CLAMP ASSEMBLY WITH ELECTRICALLY INSULATING SHOE

[75] Inventors: Donald L. Clemens, The Colony; Keith Mandell, Irving, both of Tex.

[73] Assignee: Thermalloy, Inc., Dallas, Tex.

[21] Appl. No.: 223,011

[22] Filed: Apr. 5, 1994

Related U.S. Application Data

[63] Continuation-in-part of Ser. No. 151,966, Nov. 15, 1993, abandoned.

[51] Int. Cl.$^5$ .............................................. H05K 7/20
[52] U.S. Cl. ........................... 361/704; 174/16.3; 257/713; 257/727; 411/530
[58] Field of Search ............... 174/16.3; 24/457, 458, 24/473, 625, 464, 466, 472; 411/352, 516, 522, 523, 530; 165/80.3, 185; 267/150, 160; 248/316.7, 505, 510; 257/706, 707, 713, 717, 718, 719, 727; 361/702–704, 707, 709, 718, 719, 722

[56] References Cited

U.S. PATENT DOCUMENTS

| | | | |
|---|---|---|---|
| 4,888,637 | 12/1989 | Sway-Tin | 361/702 |
| 5,068,764 | 11/1991 | Bland | 361/704 |
| 5,099,550 | 3/1992 | Beane | 24/555 |
| 5,208,731 | 5/1993 | Blomquist | 361/704 |
| 5,276,585 | 1/1994 | Smithers | 361/702 |
| 5,282,111 | 1/1994 | Hopfer | 361/704 |
| 5,307,239 | 4/1994 | McCarty | 361/704 |
| 5,313,099 | 5/1994 | Tata | 257/717 |

OTHER PUBLICATIONS

IBM Tech Discl Bull vol. 23 No. 12 May 1981 "Spring . . . Sink", Almquist, p. 5303.

*Primary Examiner*—Gerald P. Tolin
*Attorney, Agent, or Firm*—Jack A. Kanz

[57] ABSTRACT

A spring clamp and insulating shoe assembly is used to secure a finned heat sink to an electronic device package. The spring clamp body fits between or around fins or pins extending from one face of a heat sink and carries an insulating shoe which fits around the edge of the device package and has a lip which engages the opposite face of the device package to urge the device package and heat sink into mutual contact.

16 Claims, 5 Drawing Sheets

SPRING CLAMP ASSEMBLY WITH ELECTRICALLY INSULATING SHOE

This is a continuation-in-part of application Ser. No. 08/151,966 filed Nov. 15, 1993 entitled Spring Clamp Assembly with Electrically Insulating Shoe, now abandoned.

This invention relates to apparatus for securing electronic components to heat sinks for dissipation of thermal energy. More particularly, it relates to assembly of spring clamps with insulating shoe elements and a heat sink to secure the heat sink to and in thermal communication with an electronic device package.

Advances in microelectronics technology tend to develop chips which occupy less physical space while performing more electronic functions. Conventionally, the chips are packaged for use in housings which protect the chip from its environment and provide means for input/output communication between the chip and external circuitry through sockets or solder connections to a circuit board or the like. Miniaturization results in generation of more heat in less physical space with less structure for transferring heat from the package. Similarly, the development of electronic circuit device chips using compound semiconductors further expands the packaging requirements to control device temperatures by heat dissipation for devices which operate at higher temperatures.

In order to conduct heat from the chip to the exterior of the package, many device packages include a high thermal conductivity transfer medium which is in thermal communication with the chip and has a dissipation surface adjacent the surface of the package. Other packages merely conduct the heat through the material of the package itself. However, in order to dissipate heat from the package, an external heat sink must be attached to the device package. Typically, the heat sink is a body of material such as metal which has a relatively high thermal conductivity. The heat sink ordinarily has at least one flat face for positioning adjacent a face of the device package and may include fins, pins or other structures for dissipating thermal energy into the surrounding atmosphere.

To be effective, the heat sink must occupy as little space as possible while dissipating maximum amounts of thermal energy. It is also desireable that the heat sink be readily attachable to and removeable from the device package and adaptable for connection to a wide variety of different device package styles and shapes. Where large numbers of the devices are used in an assembly process, economics demand that the assembly process, including assembly of heat sinks, etc., be simple, automated, versatile and reliable. Attachment by spring clips is preferred because it is relatively fast, easy, provides good heat transfer contact pressures and can be disassembled without destruction or damage to any of the components. It is often undesireable because good spring materials are usually electrical conductors and may cause electrical shorts between input/output terminals on the package.

In accordance with the present invention, a heat sink assembly is provided in which spring clips with electrically insulated shoes are used to attach a heat sink to an electronic device package. In one embodiment the clip comprises an elongated base portion of spring material which traverses one surface of the heat sink and is positioned in and around the pins on the heat sink. Insulating shoes are attached to the ends of the spring clip and are used to removeably secure the heat sink and package together so they can be handled as a complete subassembly, thus reducing the number of loose parts and assembly steps in assembly operations. The combination of the invention may take various forms and is suitable for use in a wide variety of assembly operations. By using electrically insulating shoes to secure the heat sink to the device package, the possibility of shorting across input/output terminals with the attachment clip eliminated. Other features and advantages of the invention will become more apparent from the following description taken in connection with the appended claims and attached drawing in which:

Figure 1:
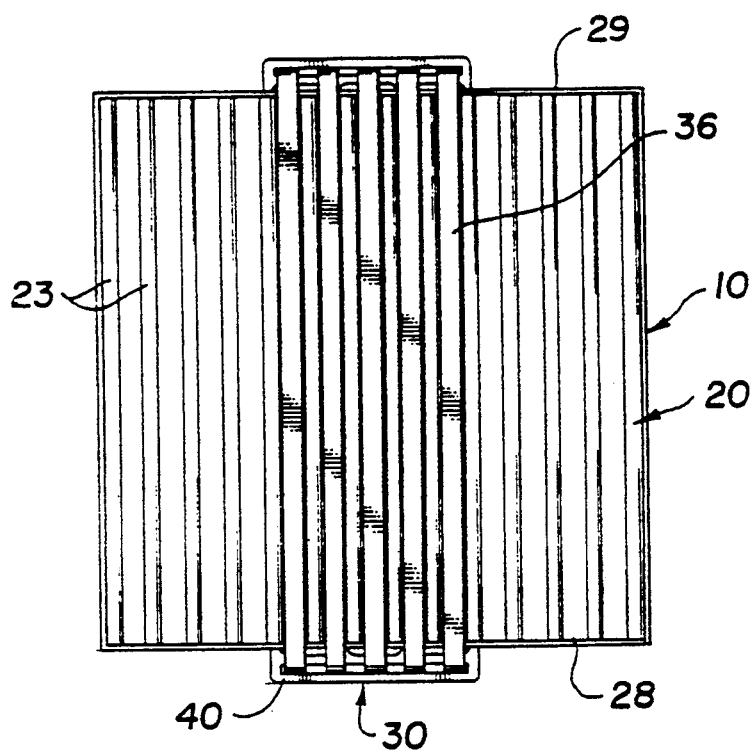
FIG. 1 is a top plan view of a heat sink attached to a device package with one embodiment of the spring clamp assembly of the present invention.
Figure 2:
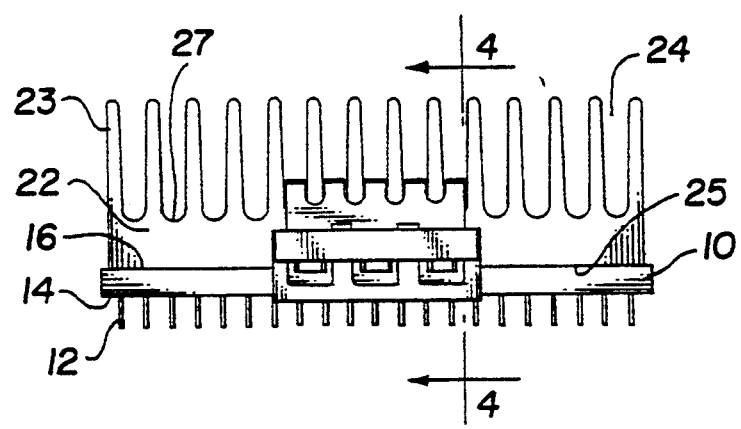
FIG. 2 is a front elevational view of the assembly of FIG. 1.
Figure 3:
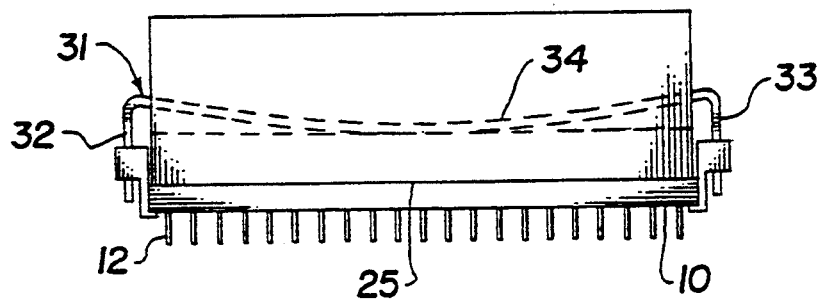
FIG. 3 is a side elevational view of the assembly of FIG. 1.

Referring now to the drawing, wherein like reference characters designate like or corresponding parts, there is shown an electronic device package 10, a heat sink 20 and a mounting strap or clamp subassembly 30 secured thereto. Package 10 has conductive input/output terminal pins 12 on mounting face 14 in a typical pin grid array. The opposite face 16 is referred to herein as a heat transfer face.

Figure 8:
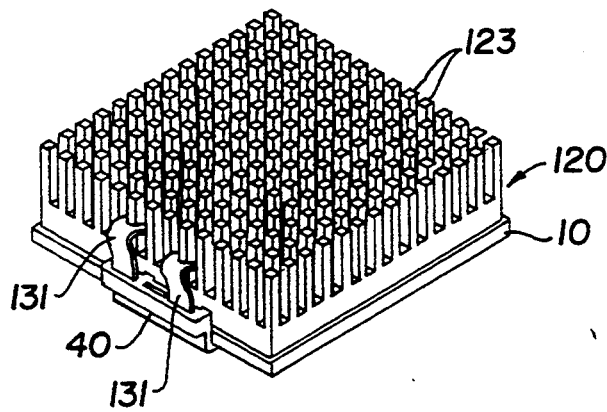
FIG. 8 is a perspective view of the clip, heat sink and package assembly of FIG. 6.

Heat sink 20 comprises a body 22 of thermally conductive material such as aluminum, aluminum alloy, copper or the like and has a substantially flat first major face 25 and fins 23 extending from the opposite face 27. In the preferred embodiment, fins 23 are formed between parallel open grooves 24 by extrusion or by sawing parallel grooves in the body 22. Fins 23 may be discontinuous, i.e., they may be formed by rows of aligned pins as shown in FIG. 8. Regardless of the method of manufacture, the body 22 has at least a plurality of parallel grooves or channels 24 extending from one end 28 to the opposite end 29 of the heat sink body 22.

In the preferred embodiment of the invention, assembly 30 is employed for mounting the heat sink 20 to package 10. Assembly 30 has an elongated spring clip body portion 31 with end portions 32 and 33 extending in the same direction substantially normal to the axis of the body portion 31 to define a generally C-shaped device which is reverse bowed at 34. The body portion 31 can be formed from any suitable material which is flexible but resilient such as steel, aluminum or the like.

Figure 5:
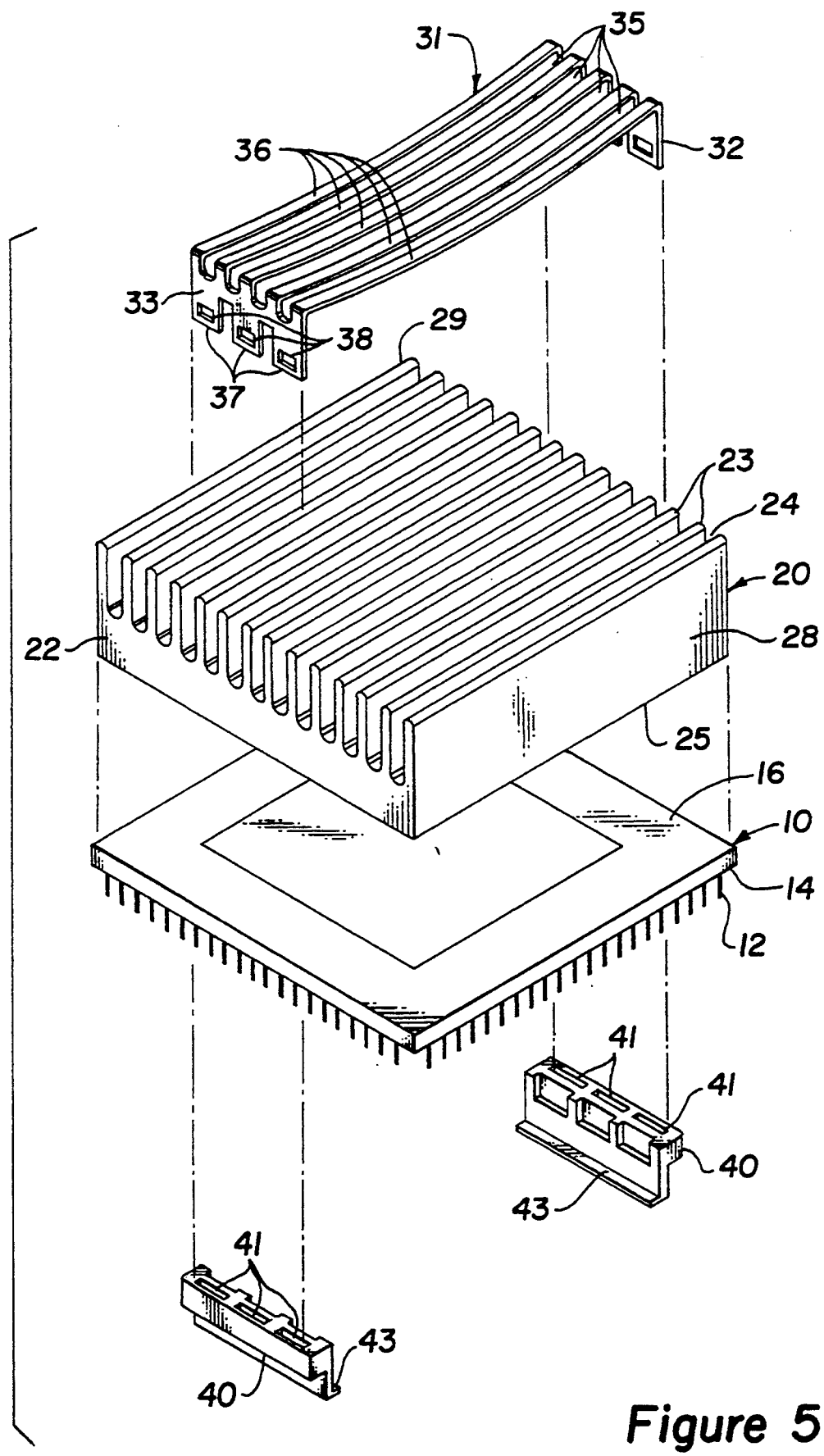
FIG. 5 is an exploded view of the assembly of FIG. 1.

As illustrated in FIG. 5 the body portion 31 has slots 35 of size and shape to receive fins 23 therein with bands 36 positioned in grooves 24. The end portions 32, 33 are positioned on opposite sides of the body 22. In the preferred embodiment tabs 37 are formed on each of the end portions and each tab 37 has a socket 38 formed therein.

Figure 4:
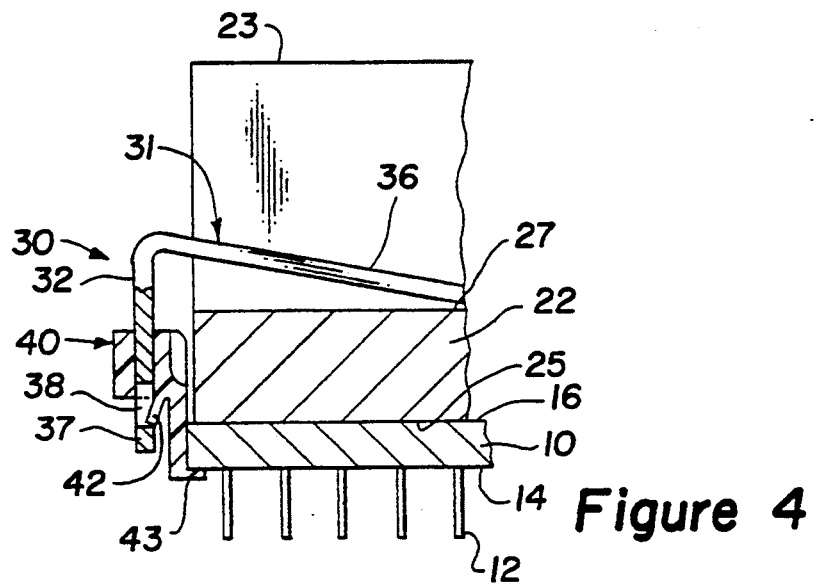
FIG. 4 is a fragmentary sectional view of the assembly of FIG. 2 taken along line 4—4.

Shoes 40 formed of insulating material such as plastic or the like are removeably attached to ends 32 and 33 by tabs 37 so that inadvertent contact with the pins 12 does not electrically connect the pins together. As shown in FIG. 4 shoes 40 have sockets 41 of a number, size and shape to receive tabs 37 therein. Locking arms 42 extend from shoes into sockets 38 to releaseably connect the shoes 40 to the tabs 37. Arms 42 are resilient so that they can be deflected out of the sockets to permit separation of the shoe from the body portion 31. A retaining shoulder 43 is formed on each shoe 40 to engage mounting face 14 and secure the package 10 and heat sink together.

Attachment of the heat sink 20 to an electronic device package 10 using the subassembly 30 is accomplished by first attaching the shoes 40 to body portion 31. The attachment may be accomplished by inserting tabs 37 into sockets 41 until arms 42 snap into sockets 38. Next the subassembly 30 is placed over heat sink 20 with the fins 23 aligned to extend through slots 35. In the embodiment illustrated, each subassembly 30 has a shoulder 43 extending laterally inwardly. The device package 10 is positioned within the subassembly 30 with face 25 of the heat sink 20 adjacent the heat transfer face 16 of the device package 10. The assembly is secured together by forcing shoes 40 around the package 10 until shoulders 43 snap into contact with face 14.

It will be realized that the device package 10, heat sink body 22 and subassembly 30 may be shipped, handled and assembled onto a circuit board or the like as a single unit. By securing the parts together, many problems associated with loose parts are eliminated and attachment of the heat sink to a device package is much easier and may even be automated.

Figure 6:
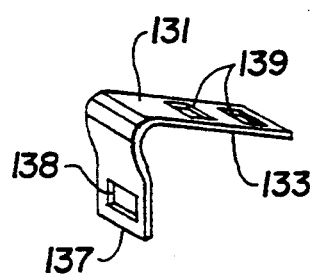
FIG. 6 is a perspective view of an alternative spring clip design.
Figure 7:
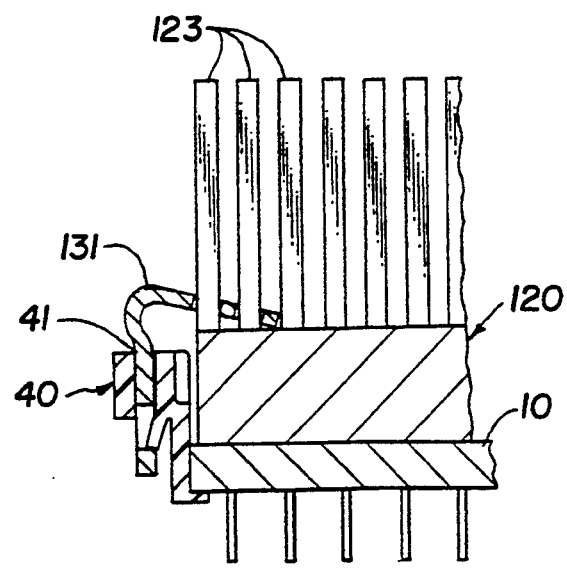
FIG. 7 is a fragmentary sectional view of a heat sink and package assembly using the clip illustrated in FIG. 6.

Various other arrangements for securing the ends of the clamp to the mounting apparatus may be devised to utilize the subassembly of the invention. FIGS. 6, 7 and 8 illustrate an alternative embodiment of the present invention particularly adapted for use with pin fin heat sinks. In this embodiment electronic device package 10 is attached to heat sink 120 by subassembly of shoes 40 and springs 131. Heat sink 120 is essentially the same as heat sink 20 except that the elongated fins of heat sink 20 have been formed into pins 123. Shoes 40 can be identical to those described above. Spring bodies 131, however, are generally L-shaped as shown in FIG. 6 with one end forming tab 137 with socket 138 therein. Tabs 137 and socket 138 are identical in construction to tabs 37 and 38 and lock into socket 41 and locking tab 42 of shoes 40 in the same manner as described above. Base portion 133 extends from the body 131 and preferably has a plurality of sockets 139 of size and shape to receive pins 123 therein as shown in FIG. 7. Sockets 139 are of a size and shape to fit around the pins 123 and engage the pins and retain the shoe 40 in the position shown in FIG. 7 to attach package 10 to heat sink 120.

Figure 9:
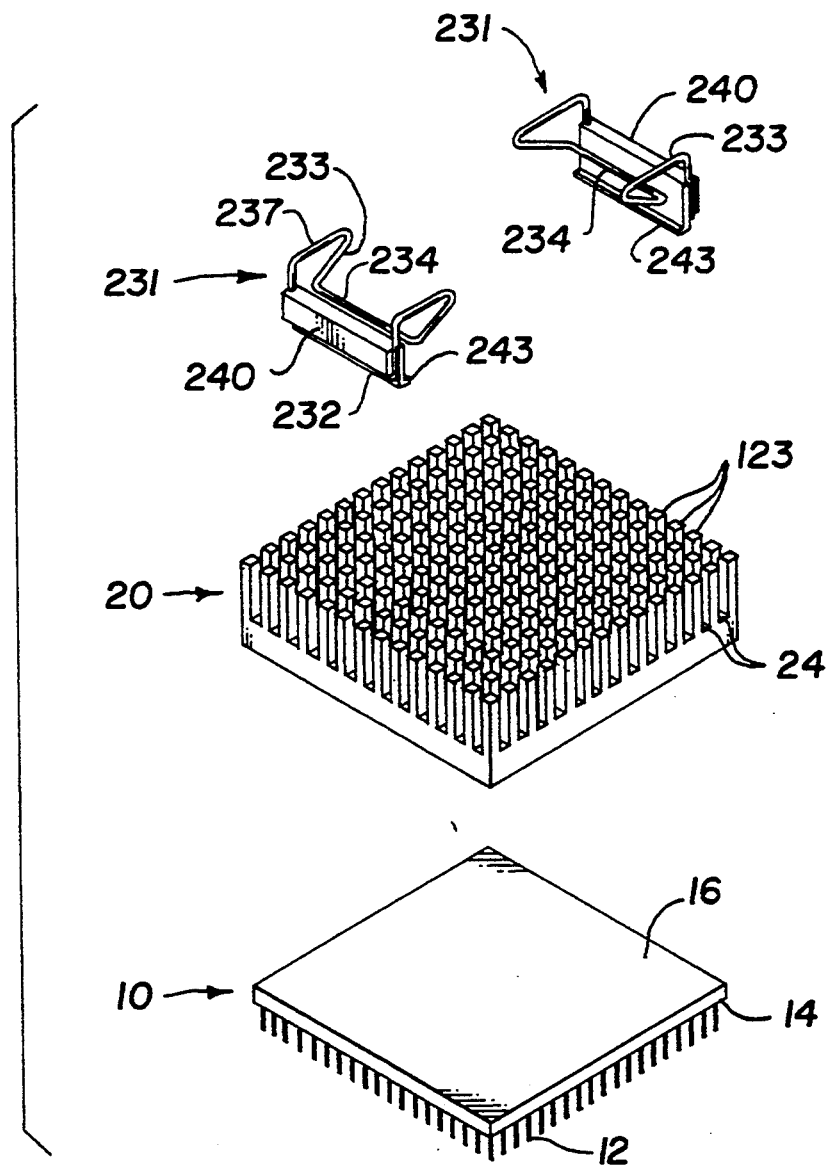
FIG. 9 is an exploded view of an assembly in accordance with the invention employing another alternative embodiment of the attachment clip.

Another embodiment of the invention is illustrated in FIG. 9 wherein the spring clips 231 are in the form of folded wire springs and the insulating shoes 240 are formed directly on the spring clips 231. The shoes 240 include an inwardly projecting lip or retaining shoulder 243 formed to engage the mounting face 14 and securing the device package 10 and heat sink 20 together. The shoe 240 may be formed directly on the clip 231 by molding or the like or may be individually formed with grooves or the like which permit the shoes 240 to be secured directly to the clips 231.

As illustrated in FIG. 9, clip 231 comprises an elongated wire spring folded to form a base portion 232 which supports the shoe 240 and a pair of parallel arms 233 folded at about 90° to the base 232 and then reverse folded. The ends of the reverse folded portions of arms 233 are interconnected by contact foot 234. To secure the assembly together, contact foot 234 is positioned in groove 24 adjacent one edge of the heat sink 20. The reverse bent arms 233 are compressed to permit shoulder 243 to move under the edge of surface 14 of the device package 10. When released, the reverse bent arms 233 return to the expanded condition and urge contact foot 234 into groove 24 while urging shoulder 243 against face 14 to hold the entire assembly together. Obviously, one or more clips 231 can be placed on opposite edges of the heat sink 20 as desired.

Figure 10:
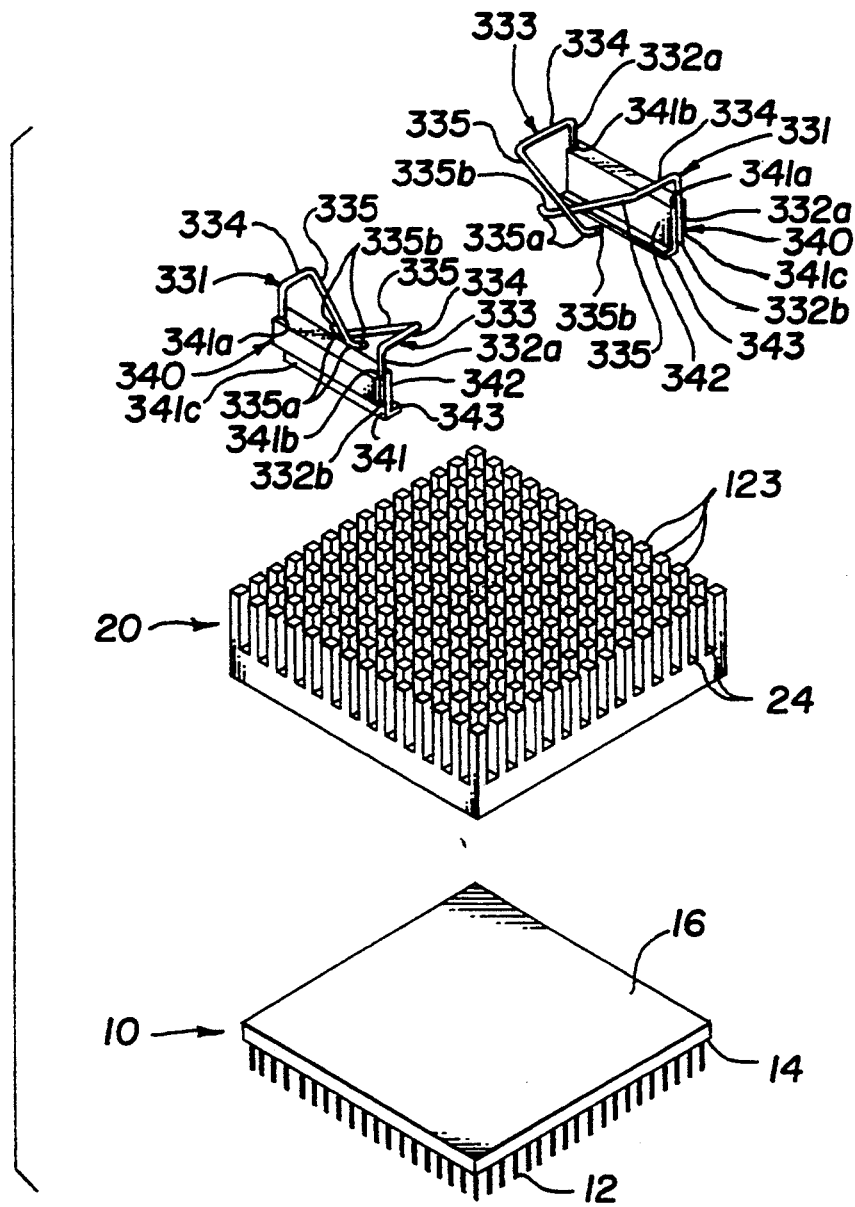
FIG. 10 is an exploded view of an assembly in accordance with the invention employing a fourth alternative embodiment of the attachment clip.

In another embodiment of the invention, illustrated in FIG. 10, the spring clips 331 are in the form of folded wire springs and the insulating shoes 340 are formed directly on the spring clips 331. Springs 331 comprise a U-shaped base 332 and a pair of spring arms 333 extending therefrom. Shoes 340 include an inwardly projecting lip or retaining shoulder 343 formed to engage the mounting face 14 and securing the device package 10 and heat sink 20 together. The shoe 340 may be formed directly on the clip 331 by molding or the like or may be individually formed with grooves or the like which permit the shoes 340 to be secured directly to the clips 331.

In the illustrated embodiment, shoe 331 has a generally rectangular shape comprising two major surfaces 341 and 342. Surface 342 faces inwardly toward the heat sink. Surface 341 faces outwardly. Lip 343 is positioned at the lower edge of surface 342. Vertical grooves 341a and 341b are provided on opposite edged of shoe 340 for receiving vertical portions of U-shaped base 332 of spring 331 and a seat 341c is provided on surface 341 for retaining the horizontal portion of spring base 332.

As illustrated in FIG. 10, clip 331 comprises an elongated wire spring folded to form a U-shaped base 332 having a horizontal portion 332b supporting the shoe 340 and a pair of spring arms 333 extending from vertical portions 332a. Each spring arm 333 include fulcrum 334 which extends from the vertical portion 332a of base 332 at approximately 90° and a lever arm 335 which extends downwardly from fulcrum 334 at approximately 90° so that lever arms 335 are essentially parallel with the plane defined by base 332 and offset at a distance equal to the length of the fulcrum 334. In addition, lever arms 335 extend downwardly in a sloping manner such that ends 335a of lever arms 335 project toward each other. Ends 335a of lever arms 335 may be provided with upwardly turned portions 335b to increase the contact area between the spring and fins 23.

To secure the assembly together, lever arms 335 are positioned in groove 24 adjacent one edge of the heat sink 20. Fulcrums 334 and the top of shoe 340 are forced toward the base 25 of heat sink 20 to permit shoulder 343 to move under the edge of surface 14 of the device package 10. As the spring 331 slides down the side of heat sink 20, lever arms 335 are pushed against grooves 24 forcing lever arms 335 to rotate about fulcrums 334 creating a spring load on the spring 231. Once lip 343 is snapped in place, the spring load on the spring 231 holds the entire assembly together. Obviously, one or more clips 231 can be placed on opposite edges of the heat sink 20 as desired.

Although the invention has been described with reference to particular embodiments, the forms of the invention shown and described are to be taken as illustrative of the principles thereof. The components of the assembly may take various other shapes and forms and may be rearranged to secure packages and heat sinks of different shapes and sizes together as described herein. Accordingly, it is to be understood that the forms of the invention shown and described in detail are to be considered examples only and that various changes, modifications and rearrangements may be resorted to without departing from the spirit and scope of the invention as defined by the appended claims.

What is claimed:

1. The combination comprising:
   (a) a heat sink having a body of thermally conductive material with at least one substantially flat first major face extending between first and second sides thereof and a second face disposed opposite said first face having at least one groove extending between said first and second sides;
   (b) an electronic device package having a heat transfer face in thermally conductive contact with said first major face on said heat sink and a mounting face opposite said heat transfer face; and
   (c) a connector joining said heat sink to said electronic device package comprising:
      (i) a spring member positioned in said at least one groove and extending between said first and second sides; and
      (ii) electrically insulating shoes independently and removeably mounted on the ends of said spring member, a surface on each said shoe engaging said mounting face.

2. The combination defined in claim 1 wherein said spring member is constructed from electrically conductive spring steel.

3. The combination defined in claim 1 wherein said spring member and said shoes each have corresponding releaseable connectors thereon releaseably connecting said shoe to said spring member.

4. The combination defined in claim 1 wherein said spring member comprises an elongated body portion with end portions extending in the same direction substantially normal to the axis of the body portion to define a C-shaped body which is reverse bowed between said ends.

5. The combination comprising:
   (a) a heat sink comprising a body of thermally conductive material having at least one substantially flat first major face extending between first and second sides and a second major face disposed opposite said first face and having at least one pin fin extending from said second major face;
   (b) an electronic device package comprising an enclosure with a heat conductive face in thermally conductive contact with said first major face of said heat sink and a mounting face opposite said heat conductive face; and
   (c) a plurality of connectors joining said heat sink to said electronic device package, each connector comprising a spring member having an electrically insulating shoe connected to said spring member and an aperture in one end of said spring member positioned with said pin fin inserted therein to connect said heat sink to said spring member with said shoe engaging said mounting face.

6. The combination defined in claim 5 wherein said spring member is constructed from electrically conductive spring steel.

7. The combination defined in claim 5 wherein said spring member and said shoe each have corresponding releaseable connectors connecting said shoe to said spring member.

8. The combination comprising:
   (a) a heat sink comprising a body of thermally conductive material having at least one substantially flat first major face extending between first and second sides and a second major face disposed opposite said first face with a plurality of grooves in said second face forming a plurality of fins therebetween;
   (b) an electronic device package comprising an enclosure with a heat conductive face in thermally conductive contact with said first major face of said heat sink and a mounting face opposite said conductive face; and
   (c) a plurality of connectors joining said heat sink to said electronic device package, each connector comprising a spring member, at least one slot in said spring member receiving at least part of one of said fins therein, and an individual electrically insulating shoe mounted on and carried by said spring member having a surface engaging said mounting face of said electronic device package.

9. The combination defined in claim 8 wherein said fins comprise rows of aligned pins.

10. The combination defined in claim 9 wherein:
    (a) said spring member extends around one of the sides of the heat sink and has an aperture which fits around at least one of said pins; and
    (b) said spring member and said shoe have cooperating connectors releaseably connecting said shoe to said spring member.

11. The combination defined in claim 9 wherein said spring member comprises an elongated wire body folded to form a base portion which supports said shoe, a pair of parallel arms folded at about 90° to the base portion and then reverse folded to define a contact foot which fits within a groove in said second face to secure the combination together.

12. The combination defined in claim 11 wherein said insulating shoe is removeably secured to said spring member.

13. The combination defined in claim 8 wherein said spring member comprises an elongated wire body folded to form a U-shaped base portion which captures and supports said shoe, a pair of parallel arms forming said slot folded at about 90° to the base portion to define a fulcrum and then folded at about 90° to said fulcrum and rotated about said fulcrum to define a pair of slanted lever arms which fit within a groove in said second face to secure the combination together.

14. The combination comprising:
    (a) a heat sink comprising a body of thermally conductive material having at least one substantially flat first major face extending between first and second sides and a second major face disposed opposite said first face with a plurality of grooves in said second face forming rows of aligned pins therebetween;

(b) an electronic device package comprising an enclosure with a heat conductive face in thermally conductive contact with said first major face of said heat sink and a mounting face opposite said conductive face; and (c) a connector joining said heat sink to said electronic device package comprising a spring member, at least one slot in said spring member receiving at least one of said pins therein, and an electrically insulating shoe on the end of said spring member having a surface engaging said mounting face of said electronic device package wherein said spring member comprises an elongated wire body folded to form a base portion which supports said shoe, a pair of parallel arms folded at about 90° to the base portion and then reverse folded to define a contact foot which fits within a groove in said second face to secure the combination together.

15. The combination defined in claim 11 wherein said insulating shoe is removeably secured to said spring member.

16. The combination comprising:

(a) a heat sink comprising a body of thermally conductive material having at least one substantially flat first major face extending between first and second sides and a second major face disposed opposite said first face with a plurality of grooves in said second face forming a plurality of fins therebetween;

(b) an electronic device package comprising an enclosure with a heat conductive face in thermally conductive contact with said first major face of said heat sink and a mounting face opposite said conductive face; and (c) a connector joining said heat sink to said electronic device package comprising a spring member, at least one slot in said spring member receiving at least part of one of said fins therein, and an electrically insulating shoe on the end of said spring member having a surface engaging said mounting face of said electronic device package wherein said spring member comprises an elongated wire body folded to form a U-shaped base portion which captures and supports said shoe, a pair of parallel arms forming said slot folded at about 90° to the base portion to define a fulcrum and then folded at about 90° to said fulcrum and rotated about said fulcrum to define a pair of slanted lever arms which fit within a groove in said second face to secure the combination together.

* * * * *